United States Patent [19]

Zhang et al.

[11] Patent Number: 5,830,786
[45] Date of Patent: Nov. 3, 1998

[54] PROCESS FOR FABRICATING ELECTRONIC CIRCUITS WITH ANODICALLY OXIDIZED SCANDIUM DOPED ALUMINUM WIRING

[75] Inventors: Hongyong Zhang; Hideki Uochi, both of Kanagawa; Shunpei Yamazaki, Tokyo; Yasuhiko Takemura, Kanagawa; Minoru Miyazaki, Kanagawa; Akane Murakami, Kanagawa; Toshimitsu Konuma, Kanagawa; Akira Sugawara, Kanagawa; Yukiko Uehara, Kanagawa, all of Japan

[73] Assignee: Semiconductor Energy Laboratory Co., Ltd., Kanagawa, Japan

[21] Appl. No.: 654,030

[22] Filed: May 28, 1996

Related U.S. Application Data

[63] Continuation of Ser. No. 199,956, Feb. 22, 1994, abandoned.

[30] Foreign Application Priority Data

Feb. 22, 1993 [JP] Japan .................................... 5-056455
Sep. 27, 1993 [JP] Japan .................................... 5-263024

[51] Int. Cl.⁶ ............................................. H01L 21/3215
[52] U.S. Cl. ........................ 438/163; 438/595; 438/635; 438/688; 438/768
[58] Field of Search ........................ 205/172, 174, 205/324, 332; 437/71, 236, 237, 101, 21, 40, 41; 438/151, 158, 163, 165, 166, 308, 595, 635, 688, 765, 784, 768

[56] References Cited

U.S. PATENT DOCUMENTS

| | | | |
|---|---|---|---|
| 3,639,221 | 2/1972 | Dorsey | 204/58 |
| 4,005,452 | 1/1977 | Cook | 437/237 |
| 4,161,430 | 7/1979 | Sogo . | |
| 4,415,606 | 11/1983 | Cynkar | 437/198 |
| 4,526,660 | 7/1985 | Garriga . | |
| 4,548,682 | 10/1985 | Yoshida et al. . | |
| 4,561,009 | 12/1985 | Yonezawa et al. . | |
| 4,645,734 | 2/1987 | Takada et al. . | |
| 4,681,657 | 7/1987 | Hwang et al. | 156/657 |
| 5,187,499 | 2/1993 | Murakami . | |
| 5,289,030 | 2/1994 | Yamazaki et al. . | |
| 5,300,209 | 4/1994 | Mori | 205/324 |
| 5,308,998 | 5/1994 | Yamazaki et al. . | |
| 5,326,712 | 7/1994 | Bae | 437/71 |
| 5,359,206 | 10/1994 | Yamamoto et al. . | |
| 5,541,007 | 7/1996 | Ueda et al. | 428/650 |
| 5,580,800 | 12/1996 | Zhang et al. | 437/40 |

FOREIGN PATENT DOCUMENTS

| | | | |
|---|---|---|---|
| 326018 | 8/1989 | European Pat. Off. . | |
| 51-37043 | 3/1976 | Japan | 205/324 |
| 51-40343 | 4/1976 | Japan | 205/324 |

(List continued on next page.)

OTHER PUBLICATIONS

I.N. Ganiev, et al., Soviet J. Appl. Chem., 60, 9 (1987) 2119, "Anodic behavior of Al:Sc(Y,Pr,Nd)", Sep. 1987.

V.A. Sokol, et al., Belarus Academy of Sciences News, 4(1988) 106 "Formation of anodic oxide films on Al containing rare earth metals", Apr. 1988.

Translation of JP 57–101695, Jun. 1982.

(List continued on next page.)

Primary Examiner—Charles L. Bowers, Jr.
Assistant Examiner—Leon Radomsky
Attorney, Agent, or Firm—Sixbey, Friedman, Leedom & Ferguson, P.C.; Gerald J. Ferguson, Jr.; Jeffrey L. Costellia

[57] ABSTRACT

A process for fabricating an electronic circuit by oxidizing the surroundings of a metallic interconnection such as of aluminum, tantalum, and titanium, wherein anodic oxidation is effected at a temperature not higher than room temperature, preferably, at 10° C. or lower, and more preferably, at 0° C. or lower. The surface oxidation rate of a metallic interconnection can be maintained constant to provide a surface free of irregularities.

8 Claims, 5 Drawing Sheets

FOREIGN PATENT DOCUMENTS

| | | | |
|---|---|---|---|
| 52-38496 | 9/1977 | Japan | 205/324 |
| 55-157238 | 12/1980 | Japan . | |
| 56-12740 | 2/1981 | Japan | 437/237 |
| 56-90536 | 7/1981 | Japan | 437/237 |
| 56-138929 | 10/1981 | Japan . | |
| 57-101695 | 6/1982 | Japan | 205/324 |
| 61-052376 | 3/1986 | Japan . | |
| 61-179839 | 8/1986 | Japan . | |
| 62-85443 | 4/1987 | Japan . | |
| 62-125633 | 6/1987 | Japan . | |
| 62-211391 | 9/1987 | Japan . | |
| 1-134426 | 5/1989 | Japan . | |
| 1-289140 | 7/1989 | Japan . | |
| 1-268840 | 10/1989 | Japan . | |
| 2-39535 | 2/1990 | Japan . | |
| 3-1572 | 1/1991 | Japan . | |
| 3-287797 | 12/1991 | Japan . | |
| 4-250626 | 9/1992 | Japan . | |
| 5-211147 | 5/1993 | Japan . | |
| 5-152573 | 6/1993 | Japan . | |
| 5-211147 | 8/1993 | Japan . | |
| 5-299655 | 11/1993 | Japan | 437/40 TFI |
| 5299655 | 11/1993 | Japan . | |
| 6-267959 | 9/1994 | Japan . | |
| 907090 | 2/1982 | U.S.S.R. | 205/324 |
| 91/02999 | 3/1991 | WIPO . | |
| 92-13360 | 8/1992 | WIPO . | |
| WO 92/13360 | 8/1992 | WIPO . | |

OTHER PUBLICATIONS

S. Wolf & R.N. Tauber, "Silicon Processing for the VLSI Era" Lattice Press, 1986 pp. 332–334, pp. 428–430, 434–437, 452–453 no month.

Translation of JP 52–38496.

Abstract of Labunov et al., Dokl, Akad. Nauk BSSR (1984), 28(3), pp. 215–218, "Characteristics of the Introduction of Electrolyte Anions into an Oxide Gilm on Aluminum" no month.

Abstract of Sokol et al., Vesti Akad. Navuk BSSR, Ser.. Fiz.–Tekh. Navuk (1988), (4), pp. 106–110, "Formation of Anodic Oxide Films on Aluminum Containing Rare Earth Metals" no month.

Abstract of Ganiev et al., Zh. Prikl. Khim. (Leningrad) (1985), 58(10), pp. 2366–2368, "Effect of Lanthanum Additions on the Anodic Behavior of Aluminum in the Neutral Medium" no month.

Abstract of Ganiev et al., J. Appl. Chem. USSR, 60.9 (1987) 2119 :Anodic Behavior of Aluminum, Scandium, (Yttrium, Praeseodymium, Neodymium) Alloys in a Neutral Medium no month.

H. Tsutsu et al., 1992 Proc. Electrochemical Soc. (TFT Symp) p. 138, "A Novel Tapered Etching Technology of AL–2%Si Alloy" no month.

S. Wolf et al., "Silicon Processing for the VLSI ERA", 1986, pp. 531–532 & 534–535, vol. 1 no month.

PROCESS FOR FABRICATING ELECTRONIC CIRCUITS WITH ANODICALLY OXIDIZED SCANDIUM DOPED ALUMINUM WIRING

This application is a Continuation of application Ser. No. 08/199,956, filed Feb. 22, 1994, now abandoned.

BACKGROUND OF THE INVENTION

1. Field of the Invention

The present invention relates to metallic interconnection of electronic circuits for use in microelectronic devices. More particularly, the present invention relates to metallic interconnection formed on semiconductor regions. In particular, the present invention relates to a structure of a gate electrode of an insulating gate field-effect transistor and manufacturing method thereof. The present invention particularly relates to one utilizing a thin film transistor.

2. Prior Art

Conventionally, good insulation between metallic interconnections has been achieved by anodically oxidizing the surroundings (the side face and/or upper surface) of the metallic interconnection (see, for example, JP-A-55-18056 (the term "JP-A-" as referred herein signifies "an unexamined Japanese patent publication")).

Metallic interconnections made of, for example, tantalum, aluminum, titanium, tungsten, molybdenum, and silicides thereof have been widely used heretofore. Most generally used as a metallic interconnection is aluminum. However, a heat treatment at a temperature of 250° C. or higher causes a pure aluminum interconnection to easily undergo a so-called formation of hillock, i.e., recrystallization and grain growth to form mechanical deformation in the structure of the interconnection. Accordingly, silicon or copper is generally added into aluminum at an amount of 5% or less to prevent disconnection from occurring on the interconnection due to the stress applied by the formation of hillocks.

It has been found, however, that the anodic oxidation form numerous holes in the aluminum interconnection containing the metal additives enumerated above. Such holes accelerate the formation of surface irregularities on the metal interconnection. This increases the probability of forming pinholes in the interlayer insulator. Furthermore, in case of introducing impurity ions into the semiconductor region by accelerating ions to a high speed and using such metallic interconnections, there has been cases of injecting impurities into the portions under the metallic interconnection through the holes formed by the anodic oxidation.

The problem above is ascribed not only to the use of aluminum containing silicon or copper, but also to the poly-crystalline nature of the metallic interconnection. That is, it has been found by the observation of the present inventors that the rate of anodic oxidation differs locally from a portion to another due to the heterogeneous structure of the polycrystalline interconnection, and that this difference in the oxidation rate may be exaggerated by some reason or another to result in an oxidation film having an irregular surface. This has been found to occur particularly on stepped portions having apparent difference in film thickness at which hillocks can be easily formed.

An insulating gate field-effect transistor utilizing a thin film semiconductor formed on an insulating substrate (hereinafter simply called as TFT) is known. This TFT is utilized as a switching device for a pixel of a liquid crystal display device of active matrix type, or is utilized as a driving device of a peripheral driver circuit. This TFT is also utilized as an image sensor and other integrated circuits.

Figure 2:
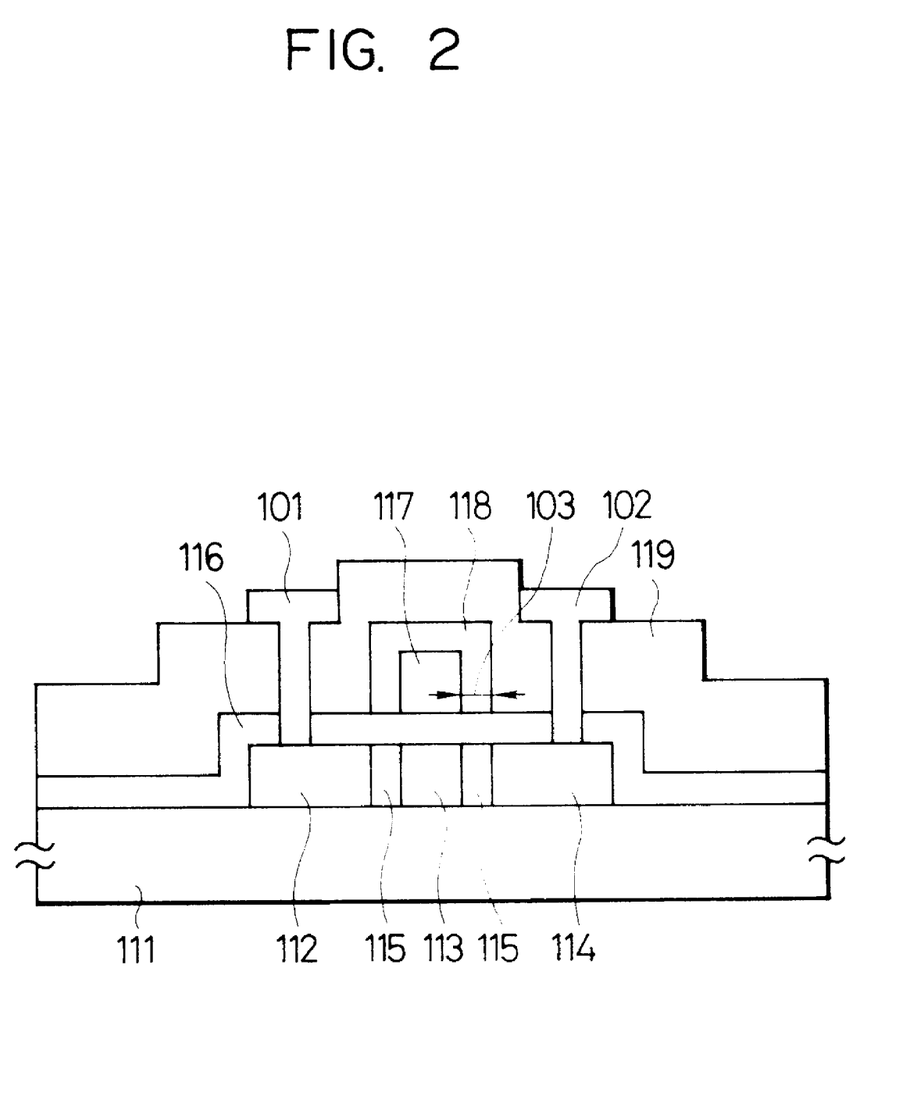
FIG. 2 shows a structure of TFT having an offset gate region.
Figure 3A:
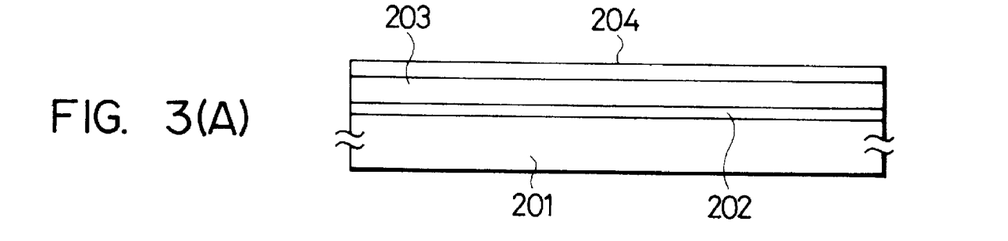
FIGS. 3(A) to 3(D) show a manufacturing method of the embodiment.
Figure 3B:
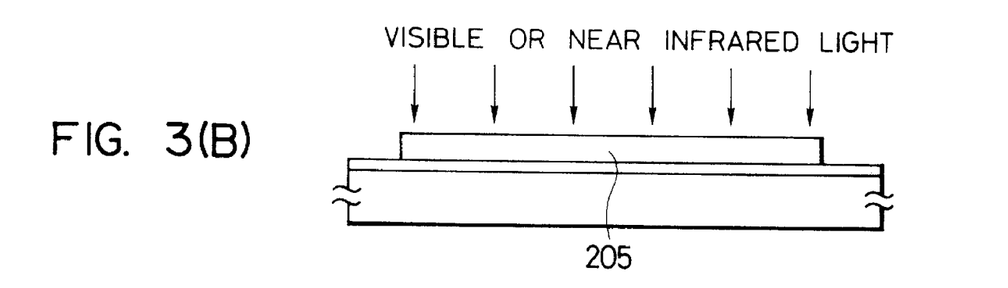
Figure 3C:
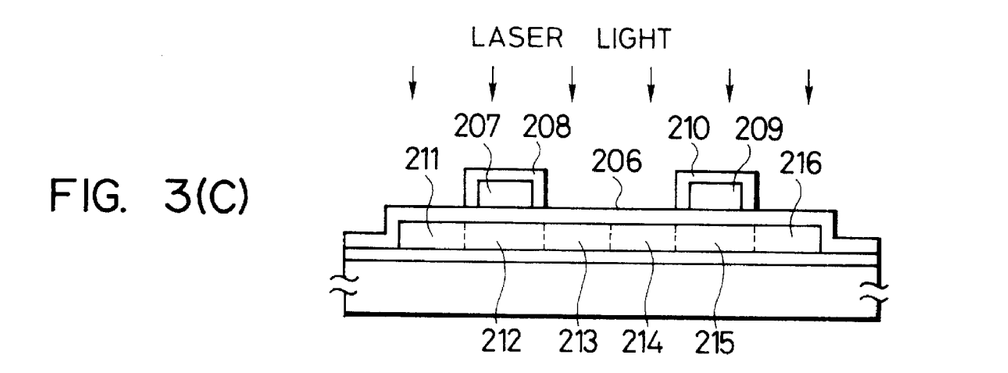
Figure 3D:
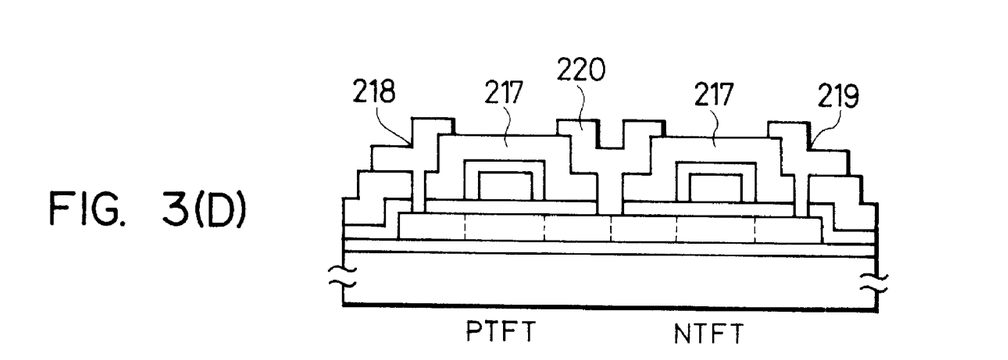

A structure shown in FIG. 2 is suggested as a structure of the TFT. FIG. 2 shows TFT provided with an active layer having source 112, drain 114, channel 113 comprising a silicon thin film of non-crystal or crystal, a gate electrode 117 mainly comprising aluminum and an oxide layer 118 peripheral thereof, an interlayer insulating film 119, a source electrode 101, and a drain electrode 102. Here, a crystal silicon film means a film mainly comprising silicon, such as, micro-crystal silicon film, poly-crystal silicon film, or semi-amorphous silicon film, which has regular structure.

What is important in the structure shown in FIG. 2 is that an offset gate region 115 is formed by utilizing the thickness of the oxide layer 118 provided around the gate electrode 117. In the structure shown in FIG. 2, the source 112 and drain 114 is formed by ion implanting method or ion doping method. In this case, the gate electrode 117 and the oxide layer 118 around thereof function as a mask.

As a result, a region functioning as a channel is shown as 115 on both sides of a part 113. A region which does not function as a channel or functions as source/drain, or has both functions is formed. This region 115 is called as an offset gate region, and functions to relax concentration of field between the channel-drain or the channel-source. By providing this offset gate region, OFF current during reverse bias is decreased, and ON-OFF ratio is improved.

On the other hand, with a width 103 of this offset gate region 115 (This is decided by the thickness of the oxide layer 118), characteristic of TFT can be controlled to some degree. Therefore, if the thickness of the oxide layer 118 cannot be formed with control, characteristic of TFT is varied.

The oxide layer 118 is formed by dipping a substrate in ethylene glycol solution (pH is controlled as neutral with ammonia) of 3% tartaric acid after forming a gate electrode 117 of aluminum, and by applying voltage to 120 V by 1–5 V/minute, for example, 4 V/minute.

The thickness of the oxide layer 118 is usually set as 1000 to 2000Å. That is, the width 103 of the offset gate region 115 is set as 500 Å to 1 μm, for example, 1000 to 2000 Å. It goes without saying that the width of the offset gate region 115 is decided if necessary. On the other hand, in forming TFT, heating process, and process of irradiating flash lamp light, and laser light is needed. In the process like these, it is necessary that the oxide layer 118 shows resistance (resistance to laser, resistance to heat).

According to many experiments by this inventor and others, if pure aluminum material is utilized as a gate electrode, aluminum is grown in an abnormal way (hillock). In the structure comprising these anodic oxide formed on the surface of an aluminum film obtained in this way, resistance to strong light like laser light (resistance to laser) is weak, and resistance to heat does not exist. Moreover, it was made clear that there is a problem. (That is, hillock is generated and an anodic oxide layer is broken. Especially by thermal treatment of 350° C. or more, hillock was produced.

The problem mentioned above is seemed to be caused by the fact that atoms of aluminum easily move from one place to another in the level of atom, when a big energy is given. To solve this problem, a method to add a material with fusion point higher than that of aluminum is added in a small amount to control movement of aluminum in the level of atom. Here, a method to add Si or Pd in aluminum is considered. By addition of such element, generation of hillock is controlled, and heat resistance is improved.

However, because the ionization rate of Si and Pd is lower than that of aluminum, there is a problem that anodic oxide cannot be formed thickly during the procedure of anodic oxidation. Moreover, because the speed of oxidation of Si, an element of Group IVb, and Pd, an element of Group VIII, is faster compared with that of aluminum, oxidation does not proceed uniformly. It is problematic that the thickness of the oxide layer is unequal and a minute oxide layer cannot be formed (see Embodiment 3). As a result, resistance to laser decreases. If a TFT shown in FIG. 2 is formed by utilizing an aluminum material like this, because the thickness of anodic oxide layer 118 varies in one place to another, it is also problematic that the width of the offset region 115 is dispersed.

SUMMARY OF THE INVENTION

The present invention has been accomplished in the light of such circumstances, and it provides a process for uniformly performing anodic oxidation on a metallic interconnection. The present invention also provides a process for fabricating an electronic circuit, such as a semiconductor integrated circuit, using the same process for performing anodic oxidation.

A first embodiment according to the present invention comprises a step of oxidizing the surroundings of a metallic interconnection of an electronic circuit by anodic oxidation, wherein, the anodic oxidation is performed at a temperature lower than room temperature.

A second embodiment according to the present invention comprises applying the constitution of the first embodiment to a process of fabricating a semiconductor circuit. More specifically, it comprises forming a metallic interconnection on a semiconductor region incorporating an insulator coating therebetween; oxidizing the surroundings of said metallic interconnection at a temperature of 10° C. or lower, preferably at 0° C. or lower; and irradiating high energy ions to the semiconductor region thereafter.

A third embodiment according to the present invention also comprises applying the constitution of the first embodiment to a process of fabricating a semiconductor circuit. It comprises forming a metallic interconnection; heating the resulting structure to 250° C. or higher; and anodically oxidizing the surroundings of the metallic interconnection at a temperature 10° C. or lower, and preferably, at a temperature of 0° C. or lower.

According to the first embodiment of the present invention, the surroundings of the metallic interconnection for use in an electronic circuit is oxidized by anodic oxidation at a temperature lower than room temperature, i.e., at 20° C. or lower, preferably at 10° C. or lower, and more preferably, at 0° C. or lower. The present inventors have found that better results can be obtained with decreasing temperature of anodic oxidation. However, on the other hand, the solvent solidifies if anodic oxidation were to be effected at such a low temperature. In case of using water as the solvent, for example, anodic oxidation cannot be effected at a temperature −5° C. or lower though the presence of a solute may somewhat lower the freezing point of the water solvent.

The process according to the present invention enables performing anodic oxidation at an even lower temperature by using a solvent having a lower solidification point. For example, a solvent containing ethylene glycol at an amount of 50% or more yields a solidification point far lower than −5° C., and enables anodic oxidation to take place at a temperature of, for example, −11° C.

The reason why an anodic oxidation at a low temperature is effective can be explained as follows. When any heterogeneous oxidation should occur due to some reason in a general anodic oxidation process, electric current concentrates on the portion where the oxidation is delayed (the portion having a thin oxide film) to compensate for the delay. This occurs because the resistance is higher for the oxidized portion as compared with the non-oxidized or thinly oxidized portion having a lower resistance. Thus, ideally, it can be seen that the anodic oxidation proceeds uniformly as a result.

In practice, however, the anodic oxidation proceeds in a somewhat non-uniform manner. The present inventors believe the non-uniform oxidation to occur depending on the temperature. If anodic oxidation occurs actively on a particular portion due to some reason, the temperature of the portion rises due to the heat generated by the exothermic chemical reaction. It then follows that the resistance of the oxide in this particular portion is lowered. If the resistance of the oxide in this portion under active anodic oxidation is lower than that of an oxide portion not under active anodic oxidation, the anodic oxidation of the former portion accelerates to increase the thickness of the oxide.

Furthermore, electrolysis may occur due to vigorous anodic oxidation to generate oxygen bubbles on the surface of the oxide. These bubbles are poor conductors of heat and enhance heterogeneous reaction to occur during the anodic oxidation.

If the above hypotheses are correct, a favorable result can be obtained by allowing the anodic oxidation to occur mildly enough in such a manner that no temperature distribution should generate due to the heat of reaction. In fact, it has been found that an oxide having a favorable surface free of irregularities can be obtained by lowering the oxidation rate. However, a low oxidation rate signifies elongating the duration of a process, and this is in conflict with favorable conditions for an industrial process.

Another solution for the problems which may be proposed in accordance with the above hypotheses is, as the present invention proposes, to effect the process at a low temperature, thereby swiftly removing the heat of reaction from the reaction site. Furthermore, by keeping the solvent at a low temperature, oxygen and other gases which generate through the reaction can be readily dissolved into the solvent. In this manner, the generation of bubbles can be suppressed, and the temperature can be maintained constant during the reaction.

As described in the foregoing, the key factor of the present invention is to maintain the spatial temperature constant. Accordingly, the temporal fluctuation in the temperature of reaction should be prevented as far as possible. The fluctuation in temperature is preferably suppressed within 5° C. or less, and more preferably, within 1° C. or less. Preferably, weak organic acids such as tartaric acid, citric acid, and oxalic acid are preferred to strong acids such as sulfuric acid and hydrochloric acid to use as the electrolyte in the process according to the present invention. More preferably, these weak acids are used by neutralizing them with a weak alkali.

According to the second embodiment of the present invention, the constitution of the first embodiment described above is applied to the process for fabricating a semiconductor circuit. More specifically, it comprises a first step of forming a metallic interconnection on a semiconductor region incorporating an insulator coating therebetween, a second step of oxidizing the surroundings of said metallic interconnection by anodic oxidation at a temperature of 10° C. or lower, preferably, at 0° C. or lower, and a third step of irradiating a high energy ion beam to the semiconductor region. Of course, the technology according to the first embodiment as described above is applied to the second step of the present process.

Since the anodically oxidized film according to the present embodiment contains extremely low amounts of surface irregularities, the probability of incidentally introducing ions into the underlying portion of the metal interconnection can be considerably lowered. It can be seen that the second embodiment according to the present invention is particularly effective in the fabrication of top-gate type thin film transistors (TFTs) in which metal interconnection is used as the gate contact.

The process according to the third embodiment of the present invention also comprises applying the constitution of the first embodiment to the fabrication of an electronic circuit. More specifically, it comprises a first step of forming a metallic interconnection, a second step of heating the resulting structure to 250° C. or higher, and a third step of oxidizing the surroundings of said metallic connection at a temperature of 10° C. or lower, preferably, at 0° C. or lower.

The process according to the third embodiment of the present invention is effective when applied to a process which comprises performing some heat treatment before effecting anodic oxidation, for instance, the step of film deposition or etching. In general, a pure metal undergoes recrystallization and grain growth when heated; thus, hillocks tend to generate and cause anodic oxidation to proceed non-uniformly. The generation of hillocks can be avoided by adding an impurity to the pure metal, but this measure results in the formation of an anodically oxidized film having an irregular surface. Accordingly, it can be seen that the process according to the present invention is effective when any heat treatment is involved.

The present invention is aimed at preventing abnormal growth of a material mainly comprising an element of IIIa Group, during oxidation process and heating process, by adding an element of IIIb Group. Here, an element of IIIa Group means Sc, Y, lanthanoid, or actinoid, and an element of IIIb Group means B, Al, Ga, In, or Tl. Specially, the present invention is characterized in that Sc (scandium) is added in aluminum by 0.05 wt % to 0.40 wt %; preferably, 0.1 wt % to 0.25 wt %. Especially if this amount is 0.05 wt % or preferably 0.1 wt % or less, heat resistance is not enough, and generation of hillock is observed at 350° C. after an hour. It is possible to utilize wet etching and dry etching for etching these material like before. In the case of performing dry etching, if the added element (such as scandium) is left as residue and particularly its amount is 0.40 wt %, preferably 0.25 wt % or more, sometimes residue is left on the surface etched by dry etching. This can be removed by washing it with pure water.

In the case that anodic oxidation is performed with the use of aluminum added with such impurities, an anodic oxide layer being minute and with equal thickness can be obtained. Abnormal growth of aluminum can be prevented by anodic oxidation process. Y, La, or lanthanoid can be utilized other than Sc. As a result, anodic oxide process can be performed with good control and repeatability. If TFT having an offset region shown in FIG. 2 is formed by anodic oxidation process like this, TFT with an offset region of equal width (that is, characteristic is homogeneous) can be obtained.

Sc has ionization rate higher than that of aluminum, and will not disturb oxidation of aluminum during anodic oxidation process. Therefore a minute oxide layer can be formed. Because effect to control movement of aluminum in the level of atom is efficient, generation of hillock by heating or during anodic oxidation process can be suppressed. Because the anodic oxide layer is minute and has a smooth surface, and because the condition of the surface of an interface between the anodic oxide layer and the aluminum film has little unevenness, reflection of light is good. As a result, laser resistance is improved.

Above mentioned is true of the case when a thin anodic oxide of 1200 Å to 300 Å or less is formed. The anodic oxide layer added with Si or Pd before did not have good heat resistance and laser resistance unless it had a thickness more than a certain degree (usually 2000 Å or more). This is because the surface of anodic oxide has unevenness on its surface; and because there are thin parts and thick parts in the thickness of anodic oxide. The anodic oxide layer is broken from the thin parts by heating or laser irradiation. However, when element of IIIb Group of the present invention is added, above mentioned unevenness was generated little because anodic oxidation proceeds equally. Therefore, even if it is a thin anodic oxide layer as thin as 300 to 1200 Å, one with good heat resistance and good laser resistance is obtained.

DETAILED DESCRIPTION OF THE INVENTION

The present invention is illustrated in greater detail referring to non-limiting examples below. It should be understood, however, that the present invention is not to be construed as being limited thereto.

EMBODIMENT 1

The present example relates to a process for fabricating a semiconductor circuit comprising a TFT. Referring to the cross section views in FIG. 1, the process is described in detail below. A 2,000 Å thick silicon oxide film was deposited as a base film 11 on the surface of a Corning #7059 substrate 10 by sputtering. Then, an amorphous silicon film was deposited thereon by plasma CVD at a thickness of from 500 to 1,500 Å, for example, 1,500 Å in this case. The structure thus obtained was annealed at 600° C. under a reducing atmosphere for a duration of 48 hours. The crystallization step can be effected by using an intense light such as of laser. The resulting crystalline silicon film was patterned into island-like silicon regions 12a and 12b.

A 1,000 Å thick silicon oxide film 13 was deposited as a gate insulator film by sputtering, and an aluminum film containing 2% of silicon was deposited thereon also by sputtering to a thickness of from 6,000 to 8,000 Å, for example, 6,000 Å. Preferably, silicon or copper is added to the aluminum film, at an amount of from 0.5 to 5% for silicon, and from 0.2 to 2% in case of copper. By adding these impurities, hillock can be prevented from generating on the aluminum film in the later step of heat treatment in the temperature range of from 250° to 350° C. It is also preferred to continuously perform the deposition of the silicon oxide film and the aluminum film. The resulting aluminum film was patterned to give interconnections 14a and 14b. The interconnection 14b functions also as a gate contact.

Figure 1A:
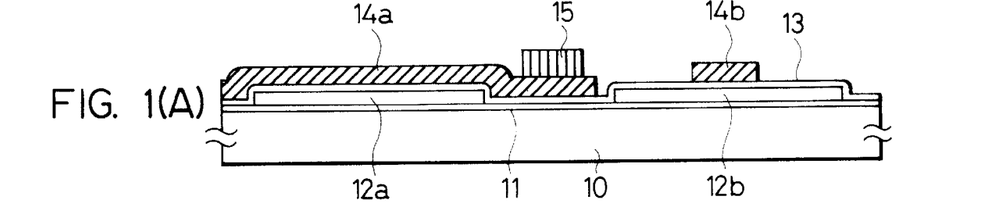
FIGS. 1(A) to 1(E) are each schematic partial cross section views of step-sequential structures for the process steps of according to the process for fabricating a semiconductor circuit of the present invention.
Figure 1B:
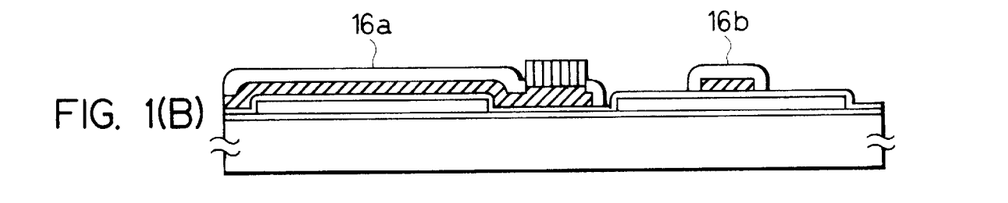

Then, the resulting structure was coated with Photoneece (a photosensitive polyimide), patterned, and baked at 250° to 350° C., for example, at 300° C. In this manner, a polyimide mask 15 for use in the anodic oxidation can be selectively formed. The mask can be formed on portions for forming contacts in the later steps and on portions separating the interconnection. The resulting structure is shown in FIG. 1(A).

Anodic oxidation was performed in the subsequent step. Tartaric acid was dissolved in ethylene glycol to obtain a solution from 1 to 5%, for example, 3% in concentration, and aqueous ammonia was added therein to adjust the pH value of the solution to about 7. Then, the solution was cooled to a temperature in the range of from −8° to +2° C., for example, −3° C., to effect anodic oxidation of the substrate 10 therein by applying electric current to the interconnections 14a and 14b using a platinum net electrode as the cathode and the substrate 10 as the anode.

During the anodic oxidation, the electric current was applied in such a manner that the voltage may increase at a rate in the range of from 3 to 6 V/min, for example, at 4 V/min, and the voltage was maintained constant at the point the voltage reached a value in the range of from 200 to 250 V, for instance, 220 V. Thus, the voltage was maintained constant until a current density of 20 A/cm$^2$ was achieved. In this manner, aluminum oxide films 16a and 16b were formed at a thickness in the range of from 1,500 to 3,000 Å, for example, at a thickness of 2,000 Å. The duration of this step of anodic oxidation is in the range of from 40 to 70 minutes, and representatively, this step takes a duration of 55 minutes. The portions having thereon the polyimide mask 15 remained un-oxidized by the mask. Thus was obtained a structure shown in FIG. 1(B).

Figure 1C:
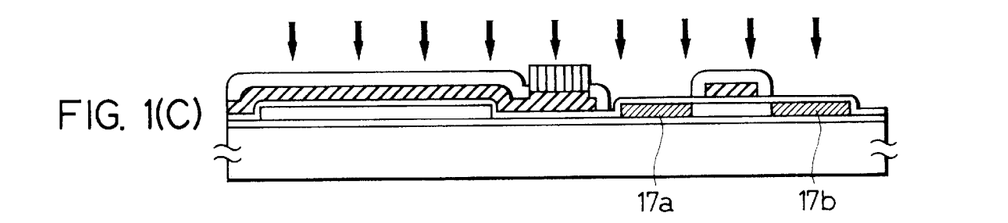
Figure 1D:
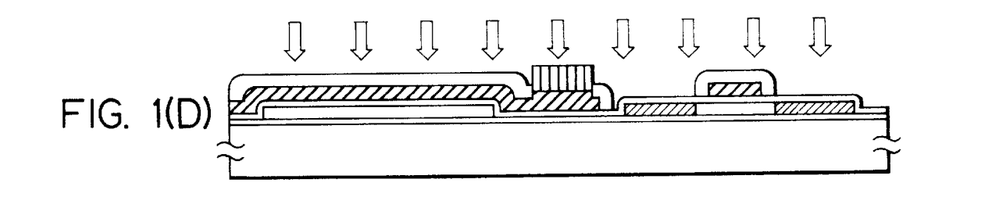
Figure 1E:
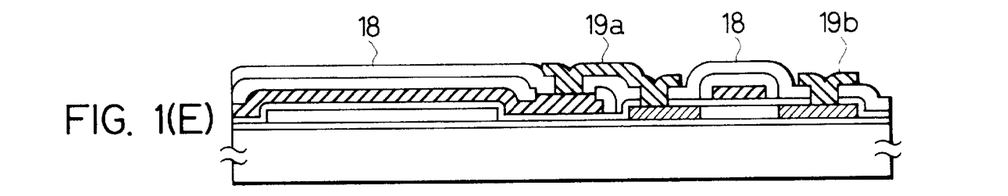

Then, impurities such as phosphorus and boron were injected into the silicon region by plasma doping using the interconnection 14b as a mask. Phosphorus can be injected by using phosphine (PH$_3$) as the doping gas at an accelerating voltage of from 60 to 90 kV, for example, at 80 kV. Boron can be injected by using diborane (B$_2$H$_6$) at an accelerating voltage of from 40 to 70 kV, for example, at 65 kV. In this manner, the impurity regions 17a and 17b were obtained as shown in FIG. 1(C).

The thus injected impurities were then activated by laser annealing. Laser annealing was performed using a KrF excimer laser operated at a wavelength of 248 nm and a pulse width of 20 nsec, and the energy density on the irradiated surface was controlled to fall in the range of from 200 to 350 mJ/cm$^2$, more specifically, for example, at 300 mJ/cm$^2$. During the laser irradiation, the substrate may be heated to a temperature range of from 200° to 400° C., for example, to 300° C. Other lasers, such as a XeF excimer laser operating at a wavelength of 353 nm or a XeCl excimer operating at a wavelength of 308 nm can be used in the place of the KrF excimer laser.

The polyimide mask 15 must be left until this step of laser annealing is completed. Otherwise, the exposed aluminum portions would be extremely damaged by the laser irradiation which is effected while heating the substrate to 200° C. or higher. The polyimide film can be easily removed by ashing in an oxygen plasma.

Subsequently, a 3,000 Å thick silicon oxide film 18 was formed as an interlayer insulator by plasma CVD, and contact holes were formed therein to establish interconnections 19a and 19b using a metal material, for example, a multilayered film of titanium nitride and aluminum. The interconnection 19a was connected with the interconnection 14a and one of the impurity regions 17a of the TFT. Thus, a semiconductor circuit structure was obtained.

Favorable electric properties were obtained on the resulting anodic oxide film 16. A film 2,000 Å in thickness yielded a withstand voltage of 100 V or higher. Almost no defects were found on the film. A uniform aluminum oxide film can be certainly obtained by a conventional process using pure aluminum, however, pure aluminum readily generates hillocks when subjected to a heat treatment at a temperature of 100° C. or higher. This signifies that such films cannot be employed in a process comprising a heating step (i.e., baking of a photosensitive polyimide film). The generation of hillocks on aluminum can be circumvented by adding silicon or copper into aluminum. However, a favorable anodic oxide cannot be obtained by using aluminum containing such additives. The present invention provides a uniform aluminum oxide film without facing such conflicting problems. Furthermore, a TFT obtained by a process according to the present invention was found to yield characteristics well comparable to those of the conventional TFTs.

EMBODIMENT 2

This embodiment is an example of forming a circuit as is shown in FIG.3(A) to (D). P channel TFT (called as PTFT) and N channel TFT(NTFT) utilizing a silicon crystal film are formed on a glass substrate 201, said PTFT and NTFT being combined in a complementary structure. The structure of this embodiment is applicable to a switching element or peripheral driver circuits of pixels of an active type liquid crystal display device; furthermore, it is applicable to an image sensor and a three-dimensional integrated circuits.

FIG. 3 shows a cross section of the manufacturing process of this embodiment. First of all, a substrate film 202 of silicon oxide of 2000 Å thickness is formed on a substrate (Corning 7059) 201, by the sputter method. The substrate may be gradually cooled at a distortion temperature or less, at 0.1° to 1.0° C./minute, after performing annealing at a temperature higher than the distortion temperature. Then shrinkage of the substrate in the process associated with temperature rising (for example, infrared light irradiation later is included) is small, and mask alignment is easily performed. In the case of utilizing a Corning 7059 substrate, it is preferable to anneal it at 620° to 660° C. for 1 to 4 hours, to cool it gradually at 0.03° to 0.3° C./minute, and then to take it out at the time when temperature is lowered as 400° to 500° C.

By the use of a plasma CVD method or a low pressure CVD method, an intrinsic (I type) amorphous silicon film 203 is formed to a 300 to 1500 Å thickness, for example, 800 Å. Furthermore, a silicon oxide film 204 or a silicon nitride film 204 is formed on it by a plasma CVD method to a 100 to 800 Å thickness, for example, 200 Å. This will be a protection film in the heat anneal process later, and will prevent unevenness of the surface of the film.

Heat annealing is performed in a nitrogen atmosphere (atmospheric pressure), at 600° C. for 48 hours. This heat annealing crystallizes the amorphous silicon film 203 to a silicon crystalline film. To improve this crystal character further, it may be effective to implant silicon ions to this silicon film with a dose amount of $1\times10^{14}$ to $1\times10^{16} cm^{-2}$ beforehand. (FIG. 3(A)) As a method to improve this crystal character, it is also effective to crystallize this by the use of laser light or RTP (rapid thermal process).

Then the silicon film is patterned and an active layer 205 of the TFT in the shape of an island is formed. The size of the active layer 205 is decided with consideration of the channel length and the channel width of the TFT. A small active region is 50 $\mu$m×20 $\mu$m, and a big active region is 100 $\mu$m×1000 $\mu$m. Many active layers like these are formed on the substrate.

Infrared light having a peak at 0.6 to 4 $\mu$m, here 0.8 to 1.4 $\mu$m, is irradiated for 30 to 180 seconds, and crystallization of the active layer is enhanced. The temperature is 800° to 1300° C., typically 900° to 1200° C., for example, 1100° C. To make the condition of the surface of the active layer good, irradiation is performed in an atmosphere of $H_2$. This process selectively heats the active layer, so that heating of the glass substrate is suppressed to a minimum. It is also very effective in decreasing defects and dangling bonds in the active layer. (FIG. 3(B))

As a light source of infrared light, a halogen lamp is utilized. Strength of visible and near infrared light is controlled so that the temperature on single-crystal silicon wafer in the monitor would be 800° to 1300° C., typically in the range of 900° to 1200° C. Specifically, the temperature of a thermo couple buried in the silicon wafer is monitored and feed back is compared to the light source of infrared light. The temperature of the surface of silicon on the glass substrate is assumed to be about ⅔ of it.

It is preferable to form a silicon oxide or silicon nitride film as a protection film on the surface of it, during infrared light irradiation; this is for improving the surface condition of the silicon layer 205. In the present invention, to improve the surface condition of the silicon film 205, irradiation is performed in a $H_2$ atmosphere. HCl, or compound of hydrogen halide, fluorine, chlorine, or bromine of 0.1 to 10 volume % can be mixed in the $H_2$ atmosphere.

Because this visible·near infrared light irradiation selectively heats the crystallized silicon film as a result, heat of the glass substrate can be minimized. Moreover, it is very effective in decreasing defects and dangling bonds in the silicon film. Furthermore, it is also effective to perform hydrogen annealing at 200° to 500° C., typically 350° C., after RTA process is finished, to decrease defects. The same result can be also obtained if ion dope of hydrogen in the amount of $1\times10^{13}$ to $1\times10^{15}$ $cm^{-2}$ is performed and heated at 200° to 300° C.

After RTA process is finished, a silicon oxide film 206 of 1000 Å thickness is deposited as a gate insulating film by a plasma CVD method. As a material gas of CVD, TEOS (tetra·ethoxy·silane, $Si(OC_2H_5)_4$) and oxygen is utilized. The temperature of the substrate during deposition is 300° to 550° C., for example, 400° C.

After deposition of the silicon oxide film 206 to be a gate insulating film, photo-annealing by irradiation of visible·near infrared light is performed again in a $N_2O$ or $NH_3$ atmosphere, in the same condition as above mentioned RTA process. Level can be dissipated mainly on the interface between the silicon oxide film 206 and the silicon film 205, and peripheral portions of them. This is very beneficial for an insulating gate type field effect transistor, since interface character between the gate insulating film and the channel formation region is very important.

By the use of a sputtering method, aluminum is deposited to a 3000 to 8000 Å thickness, for example, 6000 Å. Sc of 0.2% wt is included in this aluminum. As a material to be included in this aluminum, a rare earth element of Group IIIa can be utilized. The content of it is approximately as 0.05 to 0.40 wt %, preferably 0.1 to 0.25 wt %.

Gate electrodes 207 and 209 are formed by patterning-etching the aluminum film. A dry etching method is utilized for etching. Anodic oxidation is performed to the surface of the aluminum electrode. Oxide layers 208 and 210 are formed on the surface. This anodic oxidation is performed in ethylene glycol solution including tartaric acid at a concentration of 1 to 5%. Here, anodic oxidation is performed by raising voltage to 150 V at 4 V/minute.

The thickness of the oxide layers 208 and 210 obtained is 2000 Å. Here, these oxide 208 and 210 will be thick enough to form an offset gate region in the ion doping process later; the length of the offset gate region can be decided by above mentioned anodic oxidation process.

By performing ion doping method (also called as plasma doping method), an impurity giving P or N conductivity type in self-align way is added to a silicon film 205, with the gate electrode portion (the gate electrode 207 and the oxide layer 208 around it, the gate electrode 209 and the oxide layer 210 around it) as a mask. As a doping gas, phosphine ($PH_3$) or diborane ($B_2H_6$) is utilized. If the former is utilized, accelerating voltage is made as 60 to 90 kV, for example, 80 kV. If the latter is utilized, 40 to 80 kV, for example, 65 kV. The dose amount is approximately as $1\times10^{14}$ to $8\times10^{15} cm^{-2}$; for example, phosphorous of $2\times10^{15} cm^{-2}$, and boron of $5\times10^{15}$. Concerning doping, by covering the other region with photoresist, each element is selectively doped. As a result, N type impurity regions 214 and 216, P type impurity regions 211 and 213 are formed. Thus a region of P channel type TFT (PTFT) and a region of N channel type TFT (NTFT) can be formed.

Next, annealing is performed by irradiation of laser light. As laser light, KrF excimer laser (wavelength 248 nm, pulse width 20 nsec) is utilized, but other kinds of laser can be also used. The irradiation condition of laser light is approximately 200 to 400 $mJ/cm^2$ for energy density, for example, 250 $mJ/cm^2$. 2 to 10 shots, for example, 2 shots are irradiated at a place. Effect can be increased by heating the substrate to approximately 200° to 450° C. during irradiation of this laser light. (FIG. 3(C))

This process can be a method by lamp anneal by visible·near infrared light. Visible·near infrared light is subject to be absorbed to crystallized silicon, or amorphous silicon added with phosphorous or boron by $10^{17}$ to $10^{21} cm^{-3}$, and effective anneal as effective as heat annealing at 1000° C. or more can be performed. If phosphorous or boron is added, enough light can be absorbed even if near infrared light is utilized. This is fully expected by visual observation, because it is black. On the other hand, the light is not subject to be absorbed by a glass substrate. In a process which shrinkage of a glass substrate is a problem, this is the most appropriate method because the process is performed without heating the glass substrate at a high temperature and the time of the process is short.

A silicon oxide film 217 of 6000 Å thickness is formed as an interlayer insulator by a plasma CVD method. As this interlayer insulator, a polyimide film or a two-layered film of silicon oxide and polyimide can be utilized. Furthermore, a contact hole is formed, and electrode·connection of TFT 218, 220, and 219 is formed by a metal material such as a multilayer of titanium nitride and aluminum. Finally, annealing is performed in a hydrogen atmosphere of 1 atm at 350° C. for 30 minutes, and a semiconductor circuit with TFT in complementary structure is completed. (FIG. 3(D))

Though the structure mentioned above is a structure of CMOS providing complementary PTFT and NTFT, it is also possible to form two TFT simultaneously, and to form two independent TFT simultaneously by cutting it at the center of it.

EMBODIMENT 3

FIG. 4 shows a cross section of the manufacturing process of this embodiment. First of all, on a substrate 301 (Corning 7059 glass) a base film 302 comprising an aluminum nitride film of 2000 Å thick and a silicon oxide film of 200 Å thick is formed thereon by a sputtering method. By a plasma CVD method, an intrinsic (I type) amorphous silicon film of 500 to 1500 Å thickness, for example, 1500 Å thickness is formed. A silicon oxide film of 200 Å thickness is formed by a sputtering method on the amorphous silicon film.

This amorphous silicon film is crystallized by annealing in a nitrogen atmosphere at 600° C. for 48 hours. After annealing, the silicon film is patterned, and an island silicon region 303 is formed. Furthermore, a silicon oxide film 304 is deposited as a gate insulating film by a sputtering method, having a 1000 Å thickness. For sputtering, silicon oxide is utilized as a target. The temperature of the substrate is 200° to 400° C., for example, 250° C. The sputtering atmosphere is oxygen and argon, and argon/oxygen=0 to 0.5, for example, 0.1 or less.

Figure 4A:
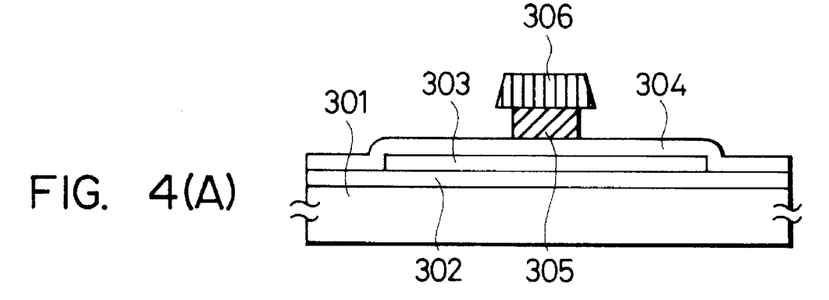
FIGS. 4(A) to 4(E) show a manufacturing method of the embodiment.
Figure 4B:
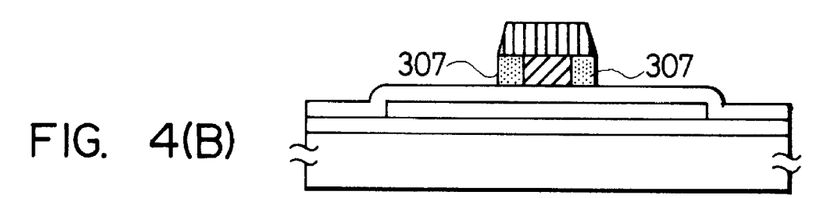
Figure 4C:
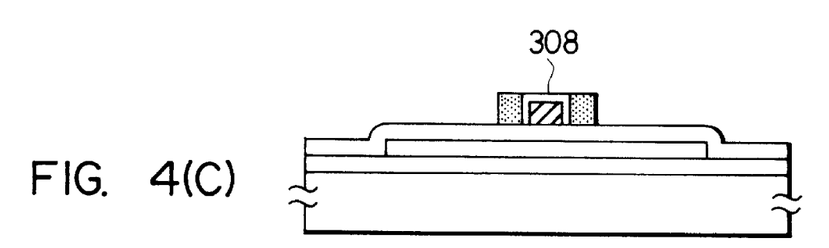

An aluminum film is deposited to a 3000 to 8000 Å thickness, for example, by 4000 Å by a sputtering method. Scandium (Sc) at 0.05 to 0.4 wt %, for example, 0.15 wt % is added to the aluminum film. Moreover, photo resist of approximately 1 μm thickness is formed on this aluminum film by a spin coat method. This photoresist has good pressure resistance, like AZ1350 made by Shipley, Co. Ltd. By a known photolithography method, a gate electrode 305 is patterned. A wet etching method is utilized for etching, and mixed acid of phosphoric acid and nitric acid is utilized as an etchant. As a result, a photo resist mask 306 is left on the gate electrode. By the use of photosensitive polyimide (photo varnish) like R3800 made by Tokyo Rayon in place of photo resist can make the same kind of structure. (FIG.4 (A))

The substrate is dipped in 10% citric acid solution, and anodic oxidation is performed at 10 to 50 V, for example, constant voltage of 10 V, for 10 to 50 minutes, for example, 30 minutes. Porous anodic oxide 307 is formed on the side face of the gate electrode having a 4000 Å to 10000 Å (1 μm) thickness, here approximately 5000 Å, with ±200 Å accuracy. Anodic oxidation can be performed in 8% oxalic solution at 30 to 40 V. Because a mask material exists on the surface of the gate electrode, anodic oxidation proceeds little. (FIG.4(B))

By removing the mask material, the surface of the gate electrode is exposed, and the substrate is dipped in 3% tartaric acid ethylene glycol solution (pH is controlled as neutral with ammonia). Current is flown to this, and voltage is raised to 80 V by 1 to 5 V/minute, for example, 4 V/minute. Here, anodic oxidation is performed to not only the surface of the gate electrode but also the side face of the gate electrode, and minute anodic oxide 308 is formed by 1000 Å thickness. Dielectric strength of the anodic oxide layer is 50 V or more. (FIG.4(C))

Impurity (phosphorous) is injected to a silicon region 303 with the gate electrode as a mask, by a plasma doping method. Phosphine ($PH_3$) is utilized as a doping gas, and accelerating voltage is approximately as 60 to 90 kV, for example, 80 kV. Dose amount is approximately as $1\times10^{14}$ to $8\times10^{15}$ $cm^{-2}$, for example, $2\times10^{15}$ $cm^{-2}$. As a result, N type impurity region 309 is formed. (FIG.4(D))

Laser light is irradiated from above, and laser annealing is performed. Thus the doped impurity is activated. As laser, KrF excimer laser (wavelength 248 nm, pulse width 30 nsec) is utilized. XeCl excimer laser (wavelength 308 nm), ArF excimer laser (wavelength 193 nm), XeF excimer laser (wavelength 353 nm) can be also utilized.

Figure 4D:
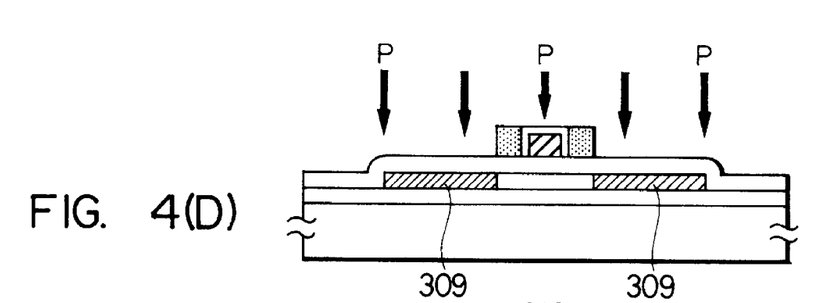
Figure 4E:
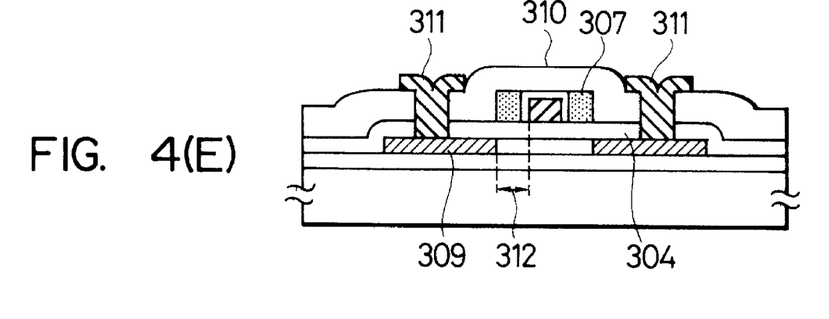

Energy density of the laser is 200 to 400 $mJ/cm^2$, for example, 250 $mJ/cm^2$. 2 to 10 shots, for example, 2 shots are irradiated. The substrate is heated as 200° to 300° C., for example, 250° C. during laser irradiation. Thus the impurity region 309 is activated. In FIG.4(D), porous anodic oxide 307 is left. The gate insulating film 307 may be removed except for the portion under the gate electrode. The gate insulating film 304 under the gate electrode can be removed. Then the porous anodic oxide 307 will not trap charge and generates instability.

A silicon oxide layer 310 of 6000 Å thickness is formed as interlayer insulator by a plasma CVD method. A contact hole is formed to this, and electrode connection 311 of the source region and drain region of TFT is formed with a metal material such as multilayer of titanium nitride and aluminum. Finally, annealing is performed at 350° C. for 30 minutes in a hydrogen atmosphere of 1 atmospheric pressure. A thin film transistor is formed in the processes mentioned above. (FIG.4(E))

Not like Embodiment 2, in this embodiment, offset of TFT (a distance between a gate electrode 305 and an end portion of source/drain region 307) is approximately as long as 5000 Å (porous anodic oxide 3000Å+un-porous anodic oxide 1000 Å), and as a result, leak current ($I_{OFF}$) is suppressed very low.

Because excessive voltage is not applied to the gate insulating film during anodic oxidation, density of interface state of the gate insulating film is small. Therefore sub-threshold characteristic (value S) of the TFT is very small. As a result, rapid onset is obtained. In this way, the TFT formed in this embodiment has a large ON/OFF ratio, and small leak current. It is appropriate for a pixel transistor of active matrix type liquid crystal display.

EMBODIMENT 4

This embodiment is an example of a comparison between the case of forming an oxide layer having a 2000 Å thickness on an aluminum film including Si at 0.2 wt % by anodic oxidation process, and the case of forming an oxide layer on an aluminum film including Sc at 0.2 wt % in the same condition. The thickness of the aluminum film is 6000 Å, and is formed by a sputter method. The anodic oxidation process is the same as that shown in Embodiment 2. An oxide layer is formed at a 2000 Å thickness in an ethylene glycol solution including tartaric acid at 1 to 5%, by raising voltage to 150 V by 4 V/minute.

Figure 5A:
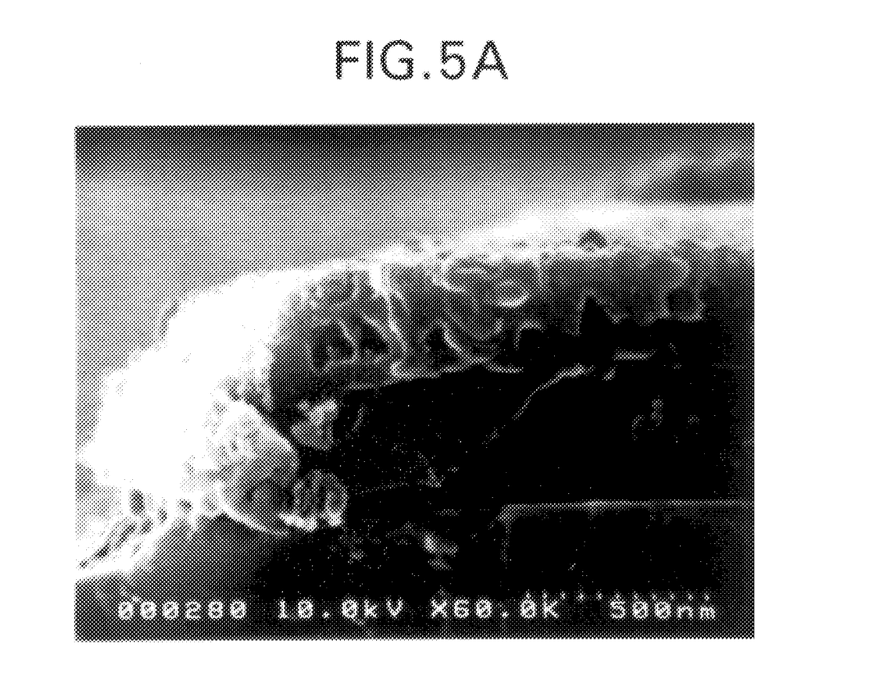
FIGS. 5(A) and 5(B) are photographs each showing a condition of a thin film formed by an anodic oxidation process.
Figure 5B:
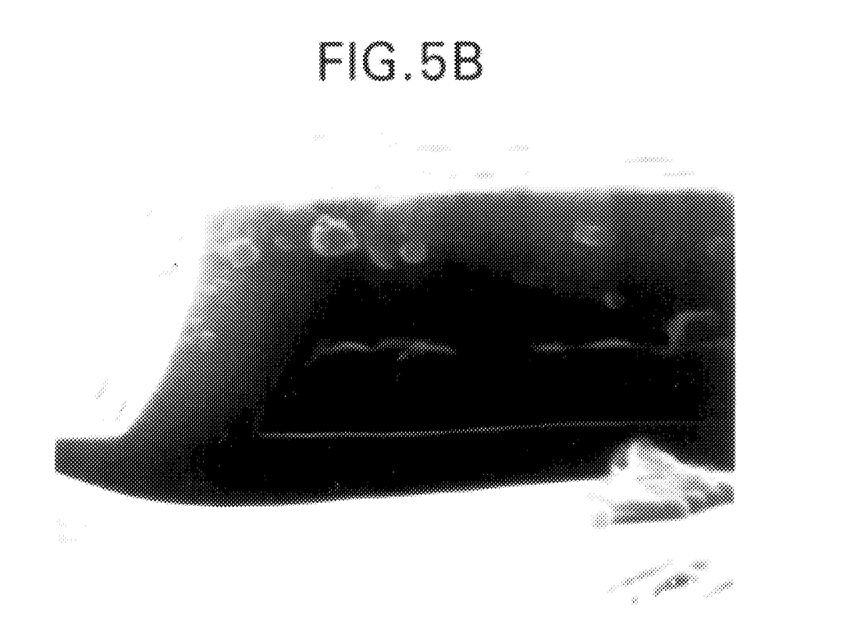

Each of FIG. 5(A) and FIG. 5(B) shows a film island mainly comprising aluminum, and the condition of an oxide layer formed around the film island by anodic oxidation process.

FIG. 5(A) shows an electro-micrograph showing cross section when Si is added to the aluminum film island. As is seen in FIG. 5(A), abnormal growth can be seen on the surface of the oxide layer, and it is not a smooth surface.

On the other hand, an electro-micrograph showing cross section when Sc is added to the aluminum film island is shown in FIG. 5(B). As is seen in FIG. 5(B), the oxide layer is minute, and abnormal growth is not seen on its surface. As is explained above, by adding Sc in aluminum, an oxide layer can be formed by anodic oxidation process minutely and with good controllability as compared with the case when Si is added to the aluminum film island.

EMBODIMENT 5

The present example relates to a process for fabricating a semiconductor circuit comprising a TFT. Referring to the cross sectional views in FIG. 1, the process is described in detail below. A 2,000 Å thick silicon oxide film was deposited as a base film 11 on the surface of a Corning #7059 substrate 10 by sputtering. Then, an amorphous silicon film was deposited thereon by plasma CVD at a thickness of from 500 to 1,500 Å, for example, 1,500 Å in this case. The structure thus obtained was annealed at 600° C. under a reducing atmosphere for a duration of 48 hours. The crystallization step can be effected by using an intense light such as of laser. The resulting crystalline silicon film was patterned into island-like silicon regions 12a and 12b.

A 1,000 Å thick silicon oxide film 13 was deposited as a gate insulator film by sputtering, and an aluminum film containing 2% of silicon was deposited thereon also by sputtering to a thickness of from 6,000 to 8,000 Å, for example, 6,000 Å. A Group IIIb element in the Periodic Table, e.g. scandium, is added to the aluminum film, at an amount of from 0.05 to 0.40 wt %, preferably from 0.1 to 0.25 wt %. By adding these impurities, hillock can be prevented from generating on the aluminum film in the later step of heat treatment in the temperature range of from 250° to 350° C. It is also preferred to continuously perform the deposition of the silicon oxide film and the aluminum film. The resulting aluminum film was patterned to give interconnections 14a and 14b. The interconnection 14b functions also as a gate contact.

Then, the resulting structure was coated with Photoneece (a photosensitive polyimide), patterned, and baked at 250° to 350° C., for example, at 300° C. In this manner, a polyimide mask 15 for use in the anodic oxidation can be selectively formed. The mask can be formed on portions for forming contacts in the later steps and on portions separating the interconnection. The resulting structure is shown in FIG. 1(A).

Anodic oxidation was performed in the subsequent step. Tartaric acid was dissolved in ethylene glycol to obtain a solution from 1 to 5%, for example, 3% in concentration, and aqueous ammonia was added therein to adjust the pH value of the solution to about 7. Then, the solution was cooled to a temperature not higher than room temperature, preferably from −8° to +2° C., for example, −3° C., to effect anodic oxidation of the substrate 10 therein by applying electric current to the interconnections 14a and 14b using a platinum net electrode as the cathode and the substrate 10 as the anode.

During the anodic oxidation, the electric current was applied in such a manner that the voltage may increase at a rate in the range of from 3 to 6 V/min, for example, at 4 V/min, and the voltage was maintained constant at the point the voltage reached a value in the range of from 200 to 250 V, for instance, 220 V. Thus, the voltage was maintained constant until a current density of 20 A/cm$^2$ was achieved. In this manner, aluminum oxide films 16a and 16b were formed at a thickness in the range of from 1,500 to 3,000 Å, for example, at a thickness of 2,000 Å. The duration of this step of anodic oxidation is in the range of from 40 to 70 minutes, and representatively, this step takes a duration of 55 minutes. The portions having thereon the polyimide mask 15 remained unoxidized by the mask. Thus was obtained a structure shown in FIG. 1(B). The anodic oxidation may be carried out in a 10% citric acid aqueous solution or in a 8% oxalic acid solution.

Then, impurities such as phosphorus and boron were injected into the silicon region by plasma doping using the interconnection 14b as a mask. Phosphorus can be injected by using phosphine (PH$_3$) as the doping gas at an accelerating voltage of from 60 to 90 kV, for example, at 80 kV. Boron can be injected by using diborane (B$_2$H$_6$) at an accelerating voltage of from 40 to 70 kV, for example, at 65 kV. In this manner, the impurity regions 17a and 17b were obtained as shown in FIG. 1(C).

The thus injected impurities were then activated by laser annealing. Laser annealing was performed using a KrF excimer laser operated at a wavelength of 248 nm and a pulse width of 20 nsec, and the energy density on the irradiated surface was controlled to fall in the range of from 200 to 350 mJ/cm$^2$, more specifically, for example, at 300 mJ/cm$^2$. During the laser irradiation, the substrate may be heated to a temperature range of from 200° to 400° C., for example, to 300° C. Other lasers, such as a XeF excimer laser operating at a wavelength of 353 nm or a XeCl excimer operating at a wavelength of 308 nm can be used in the place of the KrF excimer laser.

The polyimide mask 15 must be left until this step of laser annealing is completed. Otherwise, the exposed aluminum portions would be extremely damaged by the laser irradiation which is effected while heating the substrate to 200° C. or higher. The polyimide film can be easily removed by ashing in an oxygen plasma.

Subsequently, a 3,000 Å thick silicon oxide film 18 was formed as an interlayer insulator by plasma CVD, and contact holes were formed therein to establish interconnections 19a and 19b using a metal material, for example, a multilayered film of titanium nitride and aluminum. The interconnection 19a was connected with the interconnection 14a and one of the impurity regions 17a of the TFT. Thus was obtained the structure completed into a semiconductor circuit.

Favorable electric properties were obtained on the resulting anodic oxide film 16. A film 2,000 Å in thickness yielded a withstand voltage of 100 V or higher. Almost no defects were found on the film. Conclusively, the process according to the present invention provides a uniform anodic oxide film. Furthermore, the electric properties of the anodic oxide film obtained in accordance with the present invention are confirmed to be superior by the foregoing example. In the example, special reference was made to a case using aluminum, but same effects can be obtained by using other metal materials such as tantalum, titanium, tungsten, and molybdenum, as well as a silicide or a nitride thereof. Hence, it can be seen that the present invention is of great use in industry.

In anodic oxidation process, in forming an oxide layer on a surface of aluminum, by adding Sc in aluminum by 0.05 wt % to 0.40 wt %, preferably, 0.1 wt % to 0.25 wt %, (1) abnormal growth (hillock) of a region to be oxidized can be prevented;

(2) controllability of the thickness to be oxidized can be enhanced;

(3) a homogeneous oxide layer can be formed;

(4) heat resistance can be improved;

(5) laser resistance can be improved;

(6) if an offset region of TFT is formed, characteristic of TFT can be made the same;

(7) Because there is no abnormal growth and a minute oxide layer can be formed, a thin oxide layer can be formed.

While the invention has been described in detail and with reference to specific embodiments thereof, it will be apparent to one skilled in the art that various changes and modifications can be made therein without departing from the spirit and scope thereof.

What is claimed is:

1. A process for fabricating an insulated gate field-effect transistor comprising:

forming a metallic interconnection comprising aluminum on an insulating surface;

oxidizing a surrounding of said metallic interconnection used in said electronic circuit by anodic oxidation; and then exposing said metallic interconnection to a laser treatment, wherein scandium is added to said interconnection at a concentration from 0.05 to 0.40 weight %.

2. The process of claim 1 wherein a solvent for effecting said anodic oxidation therein contains ethylene glycol.

3. The process of claim 1 wherein said metallic interconnection crosses over an island-like semiconductor region with an insulator film incorporated therebetween.

4. The process of claim 1 wherein a solvent for effecting said anodic oxidation therein comprises an organic acid.

5. A process for fabricating an insulated gate field-effect transistor comprising:

forming a metallic interconnection comprising aluminum on an insulator film formed on a semiconductor region, wherein the metallic interconnection is not in contact with the semiconductor region directly;

forming a mask comprising an organic resin on a part of said metallic interconnection;

oxidizing a surrounding of said metallic interconnection by effecting anodic oxidation; and introducing ions of an impurity to the semiconductor region with said metallic interconnection used as a mask after effecting said anodic oxidation, wherein said aluminum includes scandium as an impurity at a concentration from 0.05 to 0.40 weight %.

6. A method for manufacturing an insulated gate field-effect transistor comprising the steps of:

forming a gate insulating film on a semiconductor layer including at least a channel region;

forming a wiring including a gate electrode on said gate insulating film, said wiring comprising aluminum;

anodic oxidizing a surface of said wiring in an electrolyte; and exposing said wiring to a heat treatment or a laser treatment, wherein said wiring is added with scandium at a concentration from 0.05 to 0.40 weight %, wherein said wiring is not in contact with said semiconductor layer directly.

7. A method of manufacturing an insulated gate field-effect transistor comprising the steps of:

forming a semiconductor film on a substrate;

forming an insulating film including a gate insulating film on said semiconductor film;

forming a film comprising aluminum on said gate insulating film;

patterning said film comprising aluminum by dry etching to form a gate electrode on said gate insulating film;

anodically oxidizing said gate electrode after said patterning; and then introducing impurity ions into portions of said semiconductor film with said gate electrode as a mask to form source and drain regions therein, wherein said film comprising aluminum is added with scandium at a concentration from 0.05 to 0.40 weight %, wherein said gate electrode is not in contact with said semiconductor film directly.

8. The method of claim 7 further comprising the step of exposing said gate electrode to a heat treatment or a laser treatment after said oxidizing.

* * * * *